US012767870B2

(12) United States Patent
Cheng et al.

(10) Patent No.: US 12,767,870 B2
(45) Date of Patent: Oct. 20, 2026

(54) LIQUID ALLOY THERMAL PASTE AND FABRICATION METHOD THEREOF

(71) Applicant: COOLER MATERIALS TECHNOLOGY INC., Taipei (TW)

(72) Inventors: Po-Wen Cheng, Taoyuan (TW); Jech-Wei Chen, Taoyuan (TW)

(73) Assignee: COOLER MATERIALS TECHNOLOGY INC., Taipei (TW)

( * ) Notice: Subject to any disclaimer, the term of this patent is extended or adjusted under 35 U.S.C. 154(b) by 532 days.

(21) Appl. No.: 18/240,937

(22) Filed: Aug. 31, 2023

(65) Prior Publication Data

US 2024/0067855 A1 Feb. 29, 2024

(30) Foreign Application Priority Data

Aug. 31, 2022 (TW) ................................. 111132926
Jun. 29, 2023 (TW) ................................. 112124211

(51) Int. Cl.

| | |
|---|---|
| ***C09K 5/10*** | (2006.01) |
| ***C09K 5/14*** | (2006.01) |
| ***C22C 28/00*** | (2006.01) |
| ***H10W 40/25*** | (2026.01) |
| *H10W 72/30* | (2026.01) |
| *H10W 90/00* | (2026.01) |

(52) U.S. Cl.

CPC .................. *C09K 5/10* (2013.01); *C09K 5/14* (2013.01); *C22C 28/00* (2013.01); *H10W 40/257* (2026.01); *H10W 72/325* (2026.01); *H10W 72/352* (2026.01); *H10W 72/353* (2026.01); *H10W 90/731* (2026.01)

(58) Field of Classification Search

CPC .... C09K 5/10; C09K 5/12; C09K 5/14; C22C 28/00; H10W 40/257; H10W 40/40; H10W 40/258; H10W 72/325; H10W 72/352; H10W 72/3524; H10W 72/353

See application file for complete search history.

(56) References Cited

U.S. PATENT DOCUMENTS 4,398,975 A * 8/1983 Ohsawa .................. C22C 28/00
148/400
4,659,384 A * 4/1987 Daigo .................... A61K 6/844
106/35

(Continued)

FOREIGN PATENT DOCUMENTS

CN 103131396 A * 6/2013
CN 103740995 A * 4/2014

(Continued)

OTHER PUBLICATIONS

Tang et al. ("Gallium-based liquid metal amalgams: transitional-state metallic mixtures with enhanced and tunable electrical, thermal, and mechanical properties," ACS Appl. Mater. Interfaces 2017, 9, 35977-35978) (Year: 2017).*

(Continued)

*Primary Examiner* — Matthew R Diaz
(74) *Attorney, Agent, or Firm* — Maschoff Brennan

(57) ABSTRACT

A liquid alloy thermal paste comprises: a liquid alloy and a trace element, the liquid alloy and the trace element are stirred and reformed to a paste-like liquid alloy mixture that is viscous and does not flow easily, and the liquid alloy mixture is used as the liquid alloy thermal paste.

6 Claims, 10 Drawing Sheets

(56) References Cited

U.S. PATENT DOCUMENTS

| | | | | | |
|---|---|---|---|---|---|
| 5,198,189 | A * | 3/1993 | Booth | C22C 1/02 | 252/387 |
| 2023/0197558 | A1 * | 6/2023 | Fan | C22C 28/00 | 257/712 |

FOREIGN PATENT DOCUMENTS

| | | | | |
|---|---|---|---|---|
| CN | 105671394 | A * | 6/2016 | C22C 28/00 |
| CN | 106167692 | A * | 11/2016 | C09K 5/10 |
| CN | 106609332 | A * | 5/2017 | C22C 28/00 |
| CN | 108192576 | A * | 6/2018 | C09K 5/14 |
| CN | 108329830 | A * | 7/2018 | C22C 32/0094 |
| CN | 110129592 | A * | 8/2019 | C22C 28/00 |
| CN | 113388769 | A * | 9/2021 | C22C 28/00 |
| CN | 113416876 | A * | 9/2021 | C22C 28/00 |
| CN | 113755141 | A * | 12/2021 | C22C 28/00 |
| CN | 114621809 | A * | 6/2022 | C22C 28/00 |
| CN | 114921676 | A * | 8/2022 | C22C 28/00 |
| EP | 2058081 | A2 * | 5/2009 | B23K 35/02 |
| JP | S60135549 | A * | 7/1985 | |

OTHER PUBLICATIONS

Ralphs et al. ("In situ alloying of thermally conductive polymer composites by combining liquid and solid metal microadditives," ACS Appl. Mater. Interfaces 2018, 10, 2083-2092) (Year: 2018).*

Chang et al. ("Recoverable liquid metal paste with reversible rheological characteristic for electronics printing", ACS Appl. Mater. Interfaces, 2020, 12, 14125-14135) (Year: 2020).*

* cited by examiner

LIQUID ALLOY THERMAL PASTE AND FABRICATION METHOD THEREOF

FIELD OF THE INVENTION

The present invention relates to a liquid alloy thermal paste and a fabrication method thereof, and more particularly relates to a liquid alloy thermal paste that is not easy to leak, easy to set up and has high thermal conduction performance and a fabrication method thereof.

BACKGROUND OF THE INVENTION

Nowadays, a large number of electronic devices are widely used in the world. The processors or electronic components in the electronic devices will generate a huge amount of heat during operation, which will cause damage to the processors and electronic components due to excessive temperature, and shorten the service life of the processors and electronic components. In order to allow these processors or electronic components to operate for a longer time and to elongate their service life, thermal management of the processors and electronic components has become a crucial issue. There're several thermal management approaches such as air-cooling by heat sink and fan, liquid cooling by non-conductive liquid, however, there's more and more research indicating that the thermal resistance is significantly increased due to the poor contact of interface in between heat sink and heat sources (chips or electronic components) and the insufficient of thermal conductivity of the thermal interface materials (TIMs) especially for the high power density chips. The thermal interface material (TIM), e.g., a thermal pastes and a heat dissipation component above a heat source of the electronic components, can improve the thermal conduction performance of the electronic components by virtue of their easy thermal conductivities and hence a good TIMs should be combined with a good interface contact (lower thermal resistance) and higher thermal conductivity.

Conventional thermal conductive materials can be categorized into solid thermal pads (e.g., traditional thermal pad, indium sheets), conventional thermal greases, and liquid metals. The traditional thermal pads are not be able to apply for high power density due to it's ultra-low thermal conductivities (less than 5 W/mk). Another emerging metal-based thermal sheet, such as indium sheets which have the advantage of being easy to set up and has relatively higher thermal conductivity (80-85 W/Mk), however, due to its poor contact on the interface of heat sources and heat sinks which may not good enough to effectively transfer heat from the processors or electronic components to the heat dissipation component. The conventional thermal greases such as silicone oil or polymer based combined with metal oxide particles, nowadays, could only provide for low power density chips due to it's lower thermal conductivity and higher thermal resistance and reliability issues such as pump-out problem. Another rising material is so called the liquid metal which provides a better contact and conductivity, however, due to it's liquid form and high surface tension natural, it is very difficult to evenly coating on the processors or electronic components. In addition, the liquid metal are prone to overflow from the processors or electronic components, causing short-circuits in the surrounding circuits.

Nowaday, the importance of advanced packaging, in the semiconductor industry are getting more and more attraction. The packaging technologies, such as the FCBGA (Flip-chip Ball Grid Array) and advanced packaging such as 2.1D, 2.3D, 2.5D and 3D ICs integrated with on substrate mounting are using the solder bumps to connect the electronic components to circuit boards or IC substrates mounting by passing through a mass reflow process at a relatively higher temperature range from 230° C. to 270° C. all requires a high performance thermal interface materials. The thermal interface material which applied for semiconductor packaging as an interfacing material for electronics devices and heat spreader is so-called the "TIM1", which can fill the gap between the electronic component and the heat dissipation component to create an effective heat transfer channel there between.

The above mentioned conventional thermal greases are made of polymer materials such as silicone oil (silicone grease) or epoxy resin, and filled with thermal conductive particles of multiple particle sizes, such as aluminum oxide powder, copper oxide powder, or other thermal conductive particles. Although this type of thermal paste has been used in the TIM1 field, most of the conventional thermal pastes have a thermal conductivity (W/mK) lower than 5 W/mK, with higher thermal resistance (>0.8 $cm^2$ k/dW@30 psi), and material deterioration such as "pump-out" after a long period of time, and thus the conventional thermal greases cannot meet the thermal conduction requirements of high-performance advanced packaged chips in the future.

Moreover, when the solid (metal) thermal pad (e.g., indium thermal pads) is used as TIM1, it has the advantages of being easy to set up and can withstand the high temperature of reflow process without denaturation, but the surface contact and tightness between the solid (metal) thermal pad and the electronic components and the heat dissipation components (heat sink or heat spreaders) are very poor, resulting in higher contact thermal resistance and lower thermal conduction performance, which causes the heat from the processors or electronic components to fail to efficiently transferred to the heat dissipation component. In addition, since metal indium thermal pads have a melting point of 157° C., they may melt in a high-temperature (over 230° C.) environment such as a reflow process during on-substrate mounting and bonding, leading to leak to other electronic components around the main chip (such as resistors and capacitors) on the IC substrate of the semiconductor package, resulting in the risk of short-circuits and damage.

On the other hand, when the liquid metal is applied for as the TIM1 application, although it has a good thermal conductivity, however, due to its liquid natural and ultra high surface tension which makes it very difficult to apply and evenly coat on the chip processors or electronic components, and it is prone to overflow (melting point of liquid metals is 10~30° C.) from the interface between the electronic component and the heat dissipation component at normal operating temperatures (0~100° C.) or even high temperatures such as a reflow process, and may leak to other electronic components (e.g., resistors and capacitors) in the semiconductor package, leading to short-circuits and damage. Therefore, the liquid metal is not able to apply for TIM1 for semiconductor packaging.

SUMMARY OF THE INVENTION

Accordingly, one objective of the present invention is to provide a liquid alloy thermal paste and a fabrication method thereof.

In order to overcome the technical problems in prior art, the present invention provides a liquid alloy thermal paste, comprising: a liquid alloy including a liquid metal and a plurality of solid metals, the liquid metal and the plurality of solid metals being alloyed or eutecticized by mixing the liquid metal and the plurality of solid metals; and trace elements, wherein by stirring and ultra high speed mixing the liquid alloy and the trace elements to reform, a viscous and paste-like liquid alloy mixture is obtained as the liquid alloy thermal paste.

In one embodiment of the present invention, the liquid alloy thermal paste is provided, wherein the liquid metal includes gallium, the solid metals include indium and tin, the liquid alloy thermal paste includes 60 to 80 wt. % of gallium, 15 to 25 wt. % of indium and 5 to 15 wt. % of tin.

In one embodiment of the present invention, the liquid alloy thermal paste is provided, wherein the trace elements are one or more elements selected from the group consisting of: boron, aluminum, gallium and indium of group IIIA elements; carbon, silicon, germanium, tin and lead of group IVA elements; nitrogen, phosphorus, arsenic, antimony and bismuth of group VA elements; and selenium and tellurium of group VIA elements.

In one embodiment of the present invention, the liquid alloy thermal paste is provided further comprising a thermal conductive particle, which is a metal, a metal oxide, a metal nitride or a carbon-based material.

In one embodiment of the present invention, the liquid alloy thermal paste is provided, wherein the metal is copper, zinc, aluminum, or gallium, the metal oxide is copper oxide, zinc oxide, or gallium oxide, the metal nitride is aluminum nitride or gallium nitride, and the carbon-based material is graphene, graphene oxide, carbon nanotubes, graphite, diamond, or synthetic diamond.

In order to overcome the technical problems in prior art, the present invention further provides a fabrication method of a liquid alloy thermal paste, comprising: a mixing step of mixing a liquid metal and a plurality of solid metals; an alloying step of alloying or eutecticizing the liquid metal and the plurality of solid metals to form a liquid alloy; a filtration step of filtering the liquid alloy to remove impurities therefrom; a reforming step of adding a trace element to the filtered liquid alloy, and stirring the liquid alloy and the trace element to reform to obtain a viscous and paste-like liquid alloy mixture; a dispersing step of dispersing the liquid alloy mixture to uniformly distribute metal particles in the liquid alloy; and a degassing step of degassing the dispersed liquid alloy mixture to remove gas from the liquid alloy to obtain the degassed liquid alloy mixture as the liquid alloy thermal paste.

In one embodiment of the present invention, the fabrication method is provided, wherein the mixing step is to mix 60 to 80 wt. % of gallium, 15 to 25 wt. % of indium and 5 to 15 wt. % of tin, and the alloying step is to alloy or eutecticize said gallium, indium and tin.

In one embodiment of the present invention, the fabrication method is provided, wherein in the reforming step, the added trace element is one or more elements selected from the group consisting of: boron, aluminum, gallium and indium of group IIIA elements; carbon, silicon, germanium, tin and lead of group IVA elements; nitrogen, phosphorus, arsenic, antimony and bismuth of group VA elements; and selenium and tellurium of group VIA elements.

In one embodiment of the present invention, the fabrication method is provided further comprising, after the reforming step and before the dispersing step, an adding step of adding a thermal conductive particle to the reformed liquid alloy, wherein the thermal conductive particle is a metal, a metal oxide, a metal nitride or a carbon-based material.

In one embodiment of the present invention, the fabrication method is provided, wherein the metal is copper, zinc, aluminum, or gallium, the metal oxide is copper oxide, zinc oxide, or gallium oxide, the metal nitride is aluminum nitride or gallium nitride, and the carbon-based material is graphene, graphene oxide, carbon nanotubes, graphite, diamond, or synthetic diamond.

With the technical means adopted by the present invention, the liquid alloy thermal paste of the present invention has a stable form to prevent flowing, has good adhesion to evenly coat onto the processors or electronic components, has excellent thermal conduction performance, such as higher thermal conductivity and lower thermal resistance, and with the paste characteristics which can avoid the problem of short-circuiting of the surrounding circuits caused by overflowing from the processors or electronic components.

Furthermore, one objective of the present invention is to provide a multi-metal alloy thermal paste and a fabrication method thereof. The multi-metal alloy thermal paste has a stable, viscous and paste-like property, good adhesion, excellent thermal conduction performance and high temperature sustainability under the mass reflow process, which can be easily and evenly coated on the processor or electronic components to avoid overflow from the processor or electronic components, can withstand high temperature processes such as a reflow process when the chip is assembled onto IC substrates and C4 bumps during package, and can be applied to TIM1 material assembly for semiconductor packaging.

In order to overcome the technical problems in prior art, the present invention further provides a multi-metal alloy thermal paste, comprising: a multi-metal liquid alloy, which is a ternary liquid alloy, a quaternary liquid alloy or a quintuple liquid alloy, including a liquid metal and a plurality of solid metals, the liquid metal including 60 to 80 wt. % of gallium, the plurality of solid metals including 15 to 25 wt. % of indium, 5 to 15 wt. % of tin, 0.1-10 wt. % of copper and 0.05-5 wt. % of a metal element of group IVA or VA elements, the liquid metal and the plurality of solid metals being alloyed or eutecticized by mixing the liquid metal and the plurality of solid metals; and a trace element, which is 0.01 to 0.5 wt. %, being one or more elements selected from the group consisting of: boron, aluminum, gallium and indium of group IIIA elements, carbon, silicon, germanium, tin and lead of group IVA elements, nitrogen, phosphorus, arsenic and antimony of group VA elements, and selenium and tellurium of group VIA elements, wherein by reforming the liquid alloy and the trace element, a viscous and paste-like liquid alloy mixture is obtained as the multi-metal alloy thermal paste.

In one embodiment of the present invention, the multi-metal alloy thermal paste is provided, wherein the copper is a spherical or irregularly shaped particle copper with a particle size of 5 nm to 5 μm.

In one embodiment of the present invention, the multi-metal alloy thermal paste is provided further comprising a thermal conductive particle, which is a metal, a metal oxide, a metal nitride or a carbon-based material.

In one embodiment of the present invention, the multi-metal alloy thermal paste is provided, wherein the metal is aluminum or gallium, the metal oxide is aluminum oxide or gallium oxide, the metal nitride is aluminum nitride or gallium nitride, and the carbon-based material is graphene, graphene oxide, carbon nanotubes, graphite, diamond, or synthetic diamond.

In order to overcome the technical problems in prior art, the present invention further provides a fabrication method of a multi-metal alloy thermal paste, comprising: a mixing step of mixing a liquid metal and a plurality of solid metals, the liquid metal including 60 to 80 wt. % of gallium, the plurality of solid metals including 15 to 25 wt. % of indium and 5 to 15 wt. % of tin; a ternary alloying step of alloying or eutecticizing the liquid metal and the plurality of solid metals to form a ternary liquid alloy; a filtration step of filtering the ternary liquid alloy to remove impurities therefrom; a reforming step of adding 0.01 to 0.5 wt. % of a trace element to the filtered ternary liquid alloy, and reforming the ternary liquid alloy and the trace element to obtain a viscous and paste-like liquid alloy mixture, wherein the trace element is one or more elements selected from the group consisting of: boron, aluminum, gallium and indium of group IIIA elements, carbon, silicon, germanium, tin and lead of group IVA elements, nitrogen, phosphorus, arsenic and antimony of group VA elements, and selenium and tellurium of group VIA elements, a quaternary alloying step of adding 0.05 to 5 wt. % of a metal element of group IVA or VA elements to the liquid alloy mixture, and stirring to form a quaternary liquid alloy; a dispersing step of dispersing the quaternary liquid alloy to uniformly distribute metal particles in the quaternary liquid alloy; a quintuple alloying step of adding 0.1 to 10 wt. % of copper to the dispersed quaternary liquid alloy and stirring to form a quintuple liquid alloy; and a degassing step of degassing the quintuple liquid alloy to remove gas from the quintuple liquid alloy to obtain the degassed quintuple liquid alloy as the multi-metal alloy thermal paste.

In one embodiment of the present invention, the fabrication method is provided, wherein the quaternary alloying step is performed in an oxygen-free atmosphere at a temperature of 10° C. to 350° C.

In one embodiment of the present invention, the fabrication method is provided, wherein the copper is a particle copper with a particle size of 5 nm to 5 μm.

In one embodiment of the present invention, the fabrication method is provided, further comprising, after the quaternary alloying step and before the dispersing step, an adding step of adding a thermal conductive particle to the quaternary liquid alloy, wherein the thermal conductive particle is a metal, a metal oxide, a metal nitride or a carbon-based material.

In one embodiment of the present invention, the fabrication method is provided, wherein the metal is aluminum or gallium, the metal oxide is aluminum oxide or gallium oxide, the metal nitride is aluminum nitride or gallium nitride, and the carbon-based material is graphene, graphene oxide, carbon nanotubes, graphite, diamond, or synthetic diamond.

Furthermore, with the technical means adopted by the present invention, the multi-metal alloy thermal paste and the fabrication method thereof can be provided, wherein the multi-metal alloy thermal paste has a stable, viscous and paste-like property, good adhesion, excellent thermal conduction performance and high temperature (greater than 230° C.) resistance to a reflow process, can be easily and evenly coated on the processor or electronic components to avoid overflow from the processor or electronic components, and has a high thermal conductivity and low thermal resistance to meet the requirements of high-power chips for thermal interface materials.

DETAILED DESCRIPTION OF THE PREFERRED EMBODIMENTS

The preferred embodiments of the present invention are described in detail below with reference to FIG. 1 to FIG. 10. The description is used for explaining the embodiments of the present invention only, but not for limiting the scope of the claims.

[Liquid Alloy Thermal Paste]

A liquid alloy thermal paste 110 according to one embodiment of the present invention comprises: a liquid alloy and a trace element.

The liquid alloy includes a liquid metal and a plurality of solid metals, and the liquid metal and the plurality of solid metals are alloyed or eutecticized by mixing the liquid metal and the plurality of solid metals.

In the liquid alloy thermal paste 110 according to one embodiment of the present invention, a viscous and paste-like liquid alloy mixture is obtained as the liquid alloy thermal paste by stirring the liquid alloy and the trace element to reform.

Figure 1:
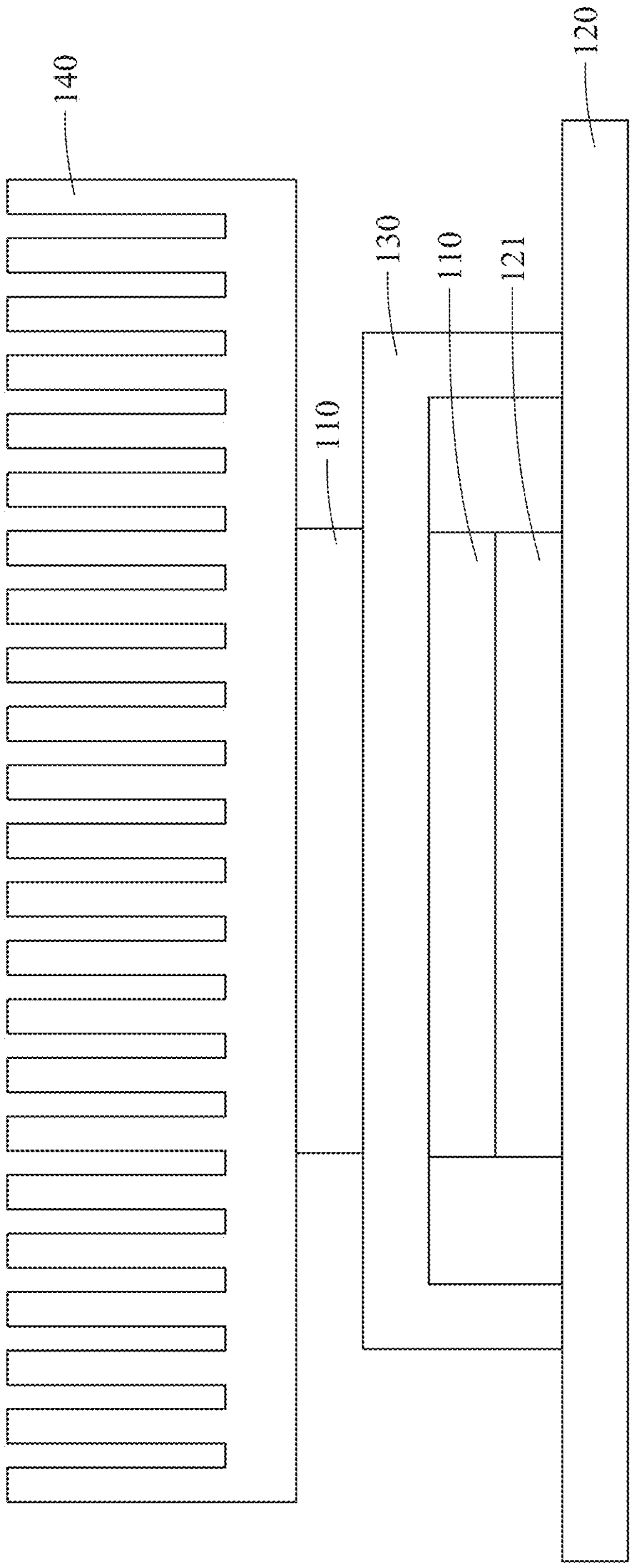
FIG. 1 is a schematic diagram illustrating a thermal paste and a heat dissipation component disposed on an electronic component according to one embodiment of the present invention.
Figure 2:
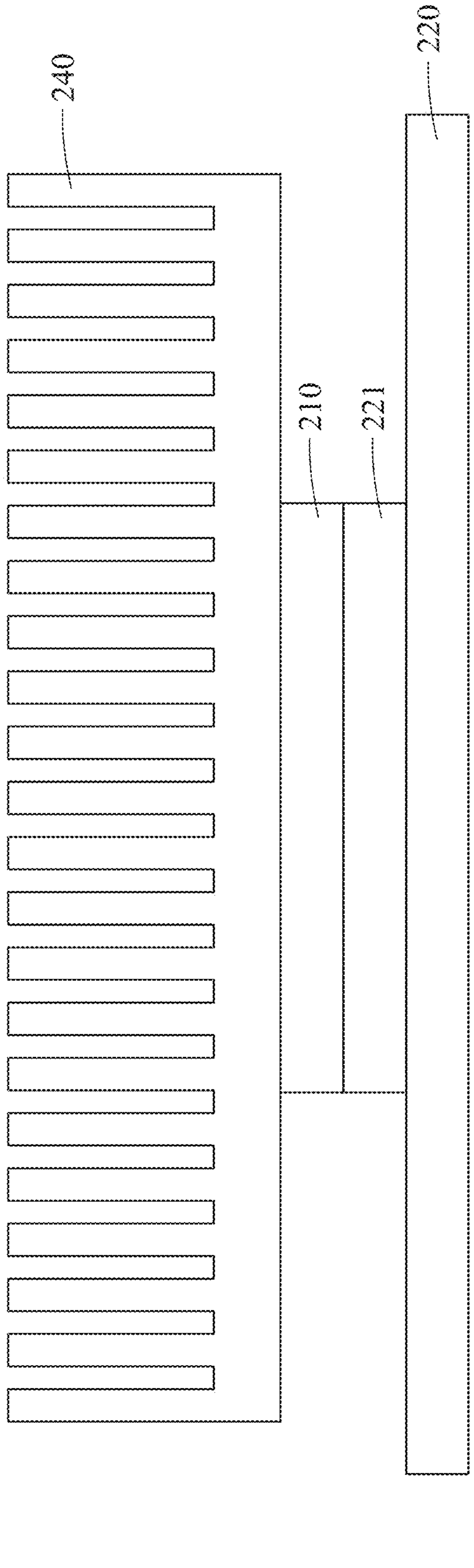
FIG. 2 is a schematic diagram illustrating a thermal paste and a heat dissipation component disposed on an electronic component according to another embodiment of the present invention.

FIG. 1 is a schematic diagram illustrating a thermal paste and a heat dissipation component disposed on an electronic component according to one embodiment of the present invention. FIG. 2 is a schematic diagram illustrating a thermal paste and a heat dissipation component disposed on an electronic component according to another embodiment of the present invention.

As shown in FIG. 1, the liquid alloy thermal paste 110 according to one embodiment of the present invention is coated and provided between an upper surface of an electronic component 121 disposed on a substrate 120 and a lower surface of a heat sink 130 as a heat dissipation component, and between an upper of the heat sink 130 and a lower surface of heat sink fins 140 as another heat dissipation component.

In this embodiment, the liquid alloy thermal paste 110 of the present invention is used as a thermal interface material (TIM) for thermal conduction.

With today's technology, no matter how it is processed, the surface of the heat dissipation component will still have rough and uneven parts so that when the surfaces of the two heat dissipation components come into contact with each other, it is impossible to form a complete contact without gaps and will still have some air trapped in the gaps, and due to the very small thermal conductivity of the air, a large contact thermal resistance will be caused, leading to a low thermal conduction performance.

Such gaps can be filled by using the thermal interface material (TIM), which can reduce the contact thermal resistance and improve the thermal conduction performance.

In detail, as shown in FIG. 1, according to one embodiment of the present invention, the liquid alloy thermal paste 110 provided between the upper surface of the electronic component 121 and the lower surface of the heat sink 130 is used as a so-called TIM1 to transfer heat generated by the electronic component 121 to the heat sink 130.

Furthermore, according to one embodiment of the present invention, the liquid alloy thermal paste 110 provided between the upper surface of the heat sink 130 and the lower surface of the heat sink fins 140 as another heat dissipation component is used as a so-called TIM2 to transfer heat from the heat sink 130 to the heat sink fins 140 through which the heat will be dissipated.

Needless to say, the present invention is not limited to the arrangement shown in FIG. 1, and as shown in FIG. 2, according to another embodiment of the present invention, a liquid alloy thermal paste 210 is coated and provided between an upper surface of an electronic component 221 disposed on a substrate 220 and a lower surface of heat sink fins 240 as a heat dissipation component.

In this embodiment, the liquid alloy thermal paste 210 provided between the upper surface of the electronic component 221 and the lower surface of the heat sink fins 240 as the heat dissipation component is used as a so-called TIM1.5 to directly transfer heat generated during the operation of the electronic component 221 to the heat sink fins 240 for heat dissipation.

The liquid alloy thermal paste 110 of the present invention forms a good thermal conduction channel between the electronic component 121 and the heat sink 130 and between the heat sink 130 and the heat sink fins 140. Furthermore, the liquid alloy thermal paste 210 of the present invention forms a good thermal conduction channel between the electronic component 221 and the heat sink fins 240. In this way, the heat generated during the operation of the electronic component 121, 221 can be effectively dissipated.

Furthermore, the liquid alloy thermal paste 110, 210 of the present invention has a stable form to prevent flowing, has good adhesion to evenly coat the processors or electronic components, and can avoid the problem of short-circuiting of the surrounding circuits caused by overflowing from the processors or electronic components.

In the liquid alloy thermal paste 110, 210 according to one embodiment of the present invention, the liquid metal includes gallium, the solid metals include indium and tin, the liquid alloy thermal paste includes 60 to 80 wt. % of gallium, 15 to 25 wt. % of indium and 5 to 15 wt. % of tin.

In the liquid alloy thermal paste 110, 210 according to one embodiment of the present invention, the trace element is one or more elements selected from the group consisting of: group IIIA elements, group IVA elements, group VA elements, and group VIA elements.

As examples of the group IIIA elements, boron (B), aluminum (Al), gallium (Ga) and indium (In) may be given. As examples of the group IVA elements, carbon (C), silicon (Si), germanium (Ge), tin (Sn) and lead (Pb) may be given. As examples of the group VA elements, nitrogen (N), phosphorus (P), arsenic (As), antimony (Sb) and bismuth (Bi) may be given. As examples of the group VIA elements, selenium (Se) and tellurium (Te) may be given.

According to one embodiment of the present invention, the liquid alloy thermal paste 110, 210 further comprises a thermal conductive particle, which is a metal, a metal oxide, a metal nitride or a carbon-based material.

As examples of the metal, copper, zinc, aluminum, or gallium may be given. As examples of the metal oxide, copper oxide, zinc oxide, or gallium oxide may be given. As examples of the metal nitride, aluminum nitride or gallium nitride may be given. As examples of the carbon-based material, graphene, graphene oxide, carbon nanotubes, graphite, diamond, or synthetic diamond may be given.

[Fabrication Method of Liquid Alloy Thermal Paste]

Figure 3:
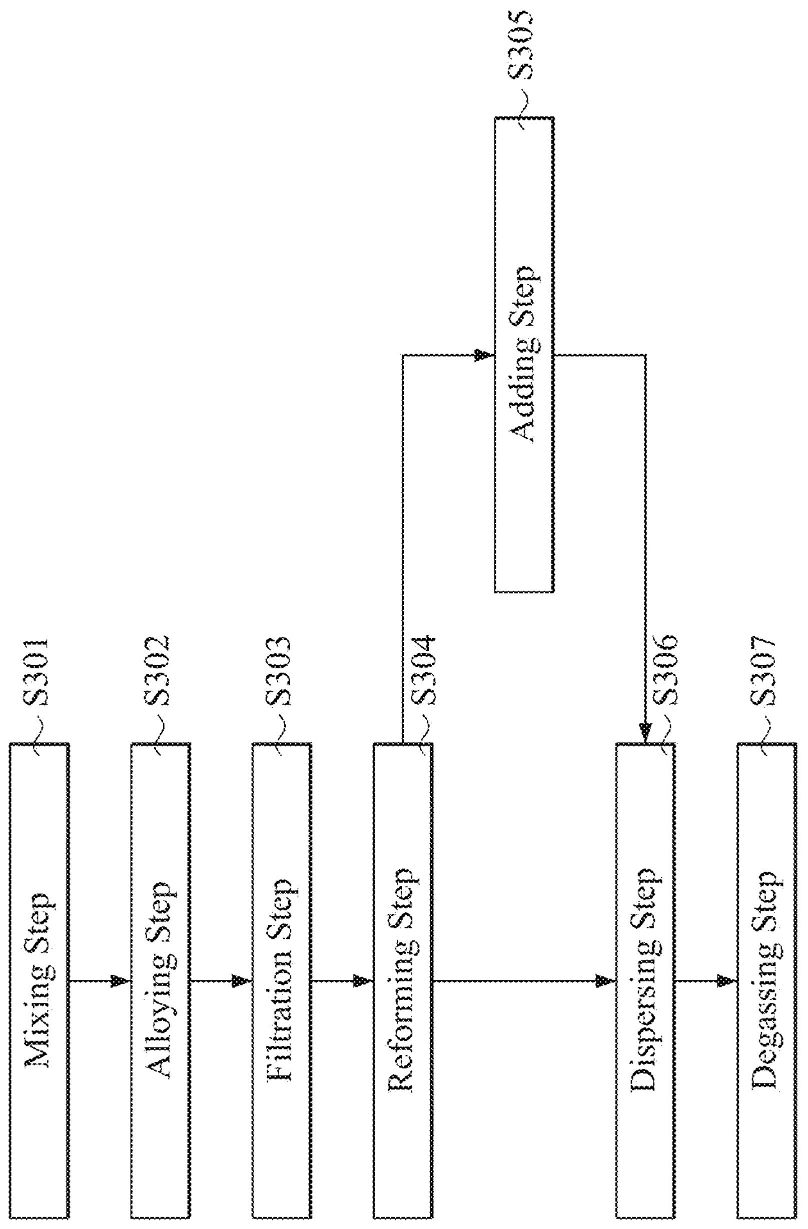
FIG. 3 is a flowchart of a fabrication method of a liquid alloy thermal paste according to the present invention.

A fabrication method of a liquid alloy thermal paste according to the present invention will be described below with reference to FIG. 3. FIG. 3 is a flowchart of a fabrication method of a liquid alloy thermal paste according to the present invention.

As shown in the figure, the fabrication method of the liquid alloy thermal paste according to the present invention comprises: a mixing step S301, an alloying step S302, a filtration step S303, a reforming step S304, a dispersing step S306 and a degassing step S307.

In the fabrication method of the liquid alloy thermal paste according to one embodiment of the present invention, the mixing step S301 is performed to mix a liquid metal and a plurality of solid metals.

Specifically, the mixing step S301 is performed to mix gallium, indium and tin. For example, 60 to 80 wt. % of gallium, 15 to 25 wt. % of indium and 5 to 15 wt. % of tin are mixed at a temperature controlled between 40° C. and 100° C.

Next, the alloying step S302 is performed to alloy or eutecticize the liquid metal and the plurality of solid metals to form a liquid alloy.

Next, the filtration step S303 is performed. In the filtration step S303, the liquid alloy is filtered to remove impurities therefrom.

Next, the reforming step S304 is performed. The reforming step S304 is to add a trace element to the filtered liquid alloy, and stir the liquid alloy and the trace element to reform to obtain a viscous and paste-like liquid alloy mixture.

Specifically, 0.01 to 0.5 wt. % of the trace element may be added to the filtered liquid alloy, wherein in the reforming step S304, the trace element is one or more elements selected from the group consisting of: boron, aluminum, gallium and indium of group IIIA elements; carbon, silicon, germanium, tin and lead of group IVA elements; nitrogen, phosphorus, arsenic, antimony and bismuth of group VA elements; and selenium and tellurium of group VIA elements.

Next, the dispersing step S306 is performed. In the dispersing step S306, the liquid alloy mixture is dispersed to uniformly distribute metal particles in the liquid alloy.

As a method of dispersing the liquid alloy mixture, devices such as a hydrodynamic shear-based mixer, a kneader, a stirred ball mill, a roller mill, a disc mill or an ultrasonic homogenizer may be used to disperse the metal particles in the liquid alloy mixture in a uniform distribution manner.

Next, degassing step 307 is performed. In the degassing step 307, the dispersed liquid alloy mixture is degassed to remove gas from the liquid alloy to obtain the degassed liquid alloy mixture as the liquid alloy thermal paste.

As a method of degassing the liquid alloy mixture, devices such as a planetary centrifugal degassing mixer, a vacuum planetary centrifugal degassing mixer, a double planetary agitational degassing mixer, a vacuum double planetary agitational degassing mixer or a vacuum degassing mixer may be used to degas the dispersed liquid alloy mixture to remove gas from the liquid alloy.

Furthermore, the present invention is not limited to this, and as shown in FIG. 3, according to one embodiment of the present invention, the fabrication method of the liquid alloy thermal paste may further comprise, after the reforming step S304 and before the dispersing step S306, an adding step S305 of adding a thermal conductive particle to the reformed liquid alloy, wherein the thermal conductive particle is a metal, a metal oxide, a metal nitride or a carbon-based material, and wherein the metal is copper, zinc, aluminum, or gallium, the metal oxide is copper oxide, zinc oxide, or gallium oxide, the metal nitride is aluminum nitride or gallium nitride, and the carbon-based material is graphene, graphene oxide, carbon nanotubes, graphite, diamond, or synthetic diamond.

Figure 4:
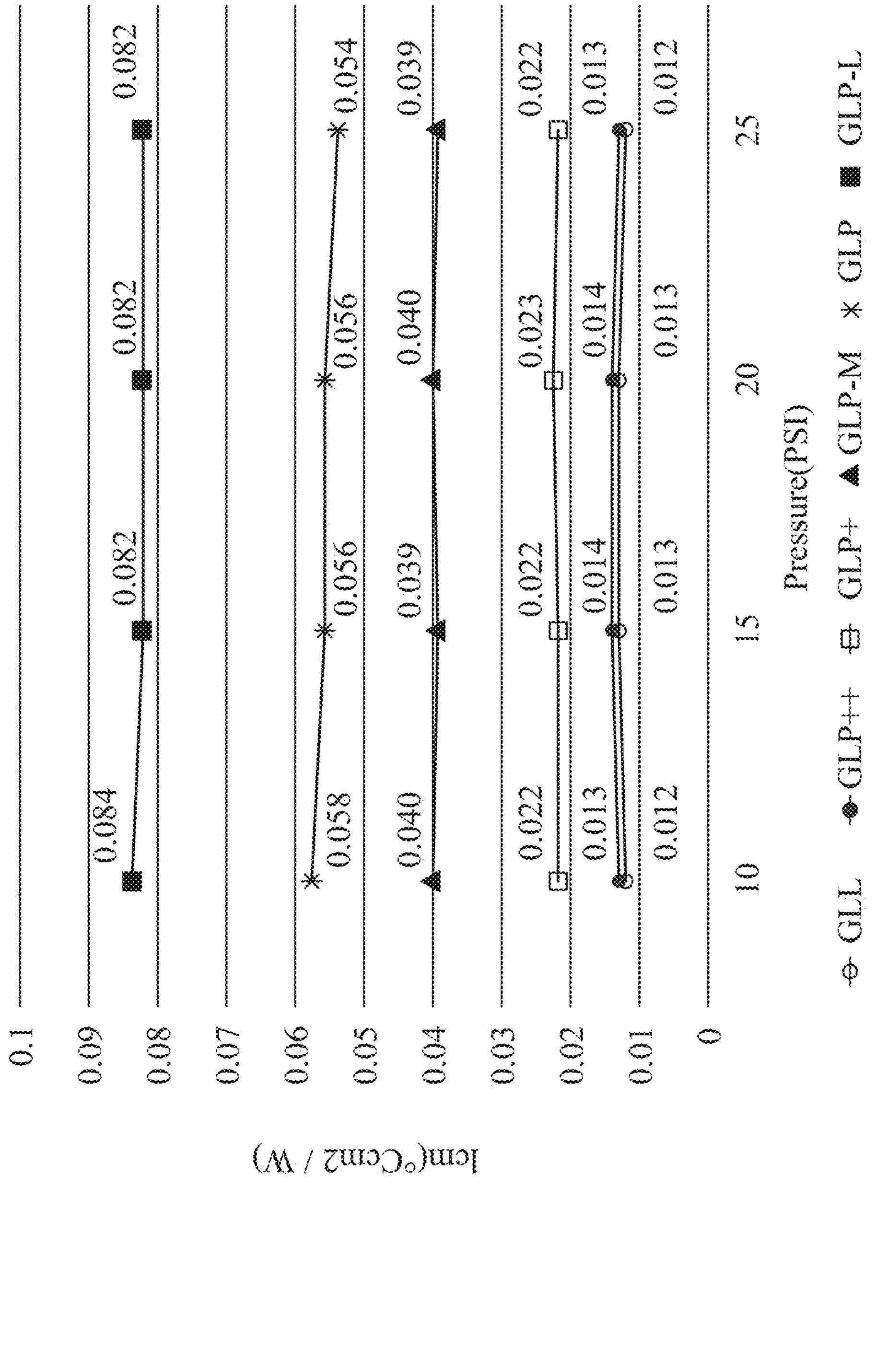
FIG. 4 is a line graph showing the thermal conduction performance of the liquid alloy thermal paste according to the present invention.
Figure 5:
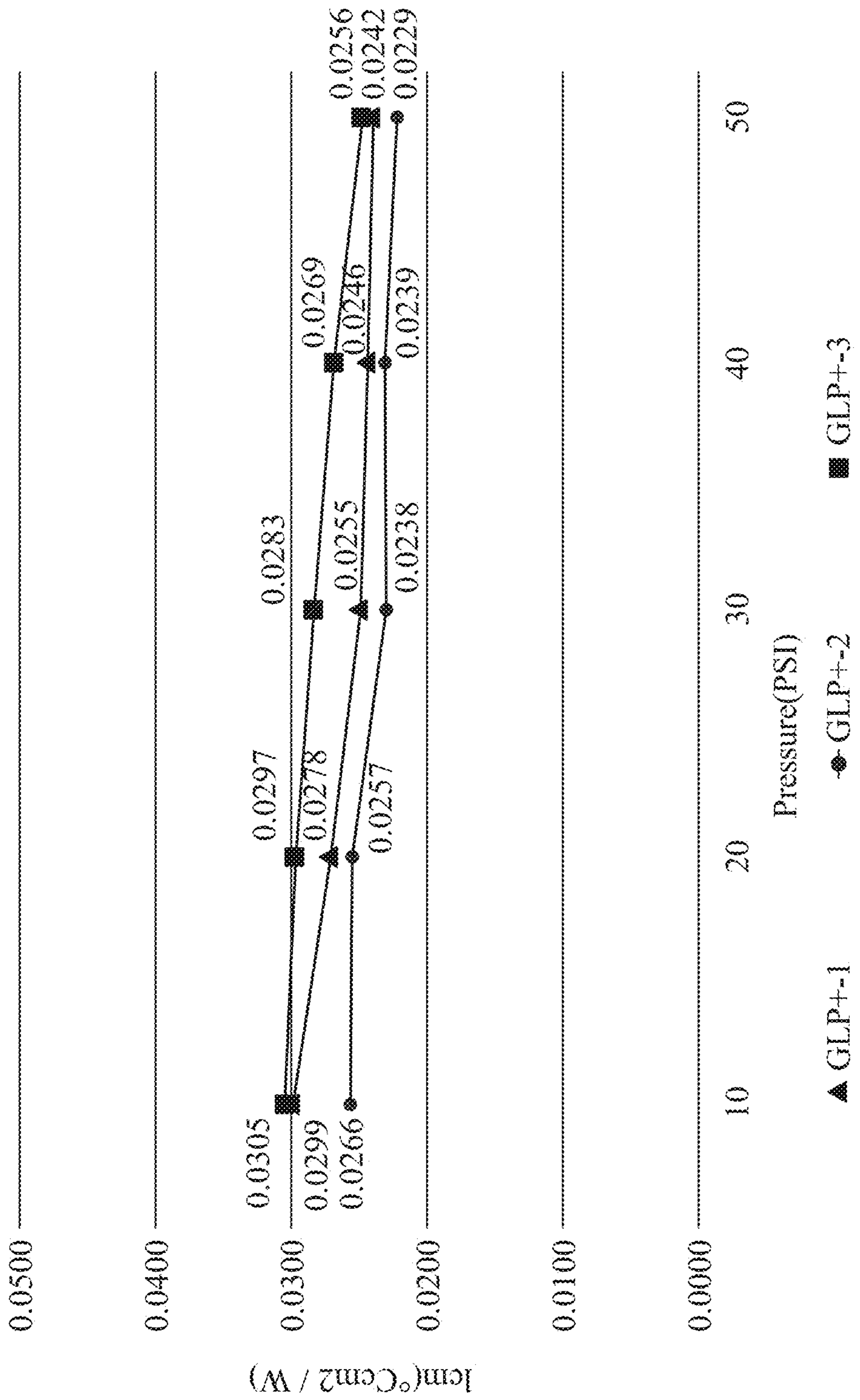
FIG. 5 is another line graph showing the thermal conduction performance of the liquid alloy thermal paste according to the present invention.

FIG. 4 is a line graph showing the thermal conduction performance of the liquid alloy thermal paste according to the present invention. FIG. 5 is another line graph showing the thermal conduction performance of the liquid alloy thermal paste according to the present invention. In FIG. 4 and FIG. 5, the vertical axis is the thermal impedance, and the horizontal axis is the pressure applied to a thermal paste.

The smaller the thermal impedance, the better the heat conduction performance. When the pressure applied to the thermal paste is increased to make the thermal conductive ingredients in the thermal paste denser, the efficiency of heat transfer increases, the thermal impedance decreases, and the thermal conduction performance becomes better. However, when the pressure applied to the thermal paste is greater than 20 PSI, the thermal impedance of the thermal paste does not change significantly. The thermal impedance of a conventional metal thermal paste can be as low as about 0.025° C. $cm^2/W$.

In FIG. 4, "GLL", "GLP++", "GLP+", "GLP-M", "GLP" and "GLP-L" are all liquid alloy thermal pastes fabricated by the fabrication method according to the present invention. It can be seen from FIG. 4 that the liquid alloy thermal pastes according to the present invention all have stable thermal conduction performance. Furthermore, "GLP+" has the same thermal conduction performance as the conventional metal thermal paste, while "GLL" and "GLP++" have better thermal conduction performance than the conventional metal thermal paste.

In FIG. 5, "GLP+−1", "GLP+−2" and "GLP+−3" are also the liquid alloy thermal pastes fabricated by the fabrication method according to the present invention. It can be seen from FIG. 5 that the liquid alloy thermal pastes according to the present invention all have stable thermal conduction performance, and have the same or even better thermal conduction performance as compared to the conventional metal thermal paste.

With the technical means adopted by the present invention, the liquid alloy thermal paste of the present invention has a stable form to prevent flowing, has good adhesion to evenly coat the processors or electronic components, has excellent thermal conduction performance, and can avoid the problem of short-circuiting of the surrounding circuits caused by overflowing from the processors or electronic components. Furthermore, by the fabrication method of the liquid alloy thermal paste of the present invention, it is possible to fabricate a liquid alloy thermal paste which has a stable form to prevent flowing, good adhesion, and excellent thermal conduction performance, and can avoid the problem of short-circuiting of the surrounding circuits caused by overflowing from the processors or electronic components.

[Multi-Metal Alloy Thermal Paste]

A multi-metal alloy thermal paste 610 according to one embodiment of the present invention comprises: a multi-metal liquid alloy and a trace element.

Specifically, the multi-metal liquid alloy includes a liquid metal and a plurality of solid metals, wherein the liquid metal includes 60 to 80 wt. % of gallium, the plurality of solid metals include 15 to 25 wt. % of indium, 5 to 15 wt. % of tin, 0.1-10 wt. % of copper and 0.05-5 wt. % of a metal element of group IVA or VA elements, the liquid metal and the plurality of solid metals are alloyed or eutecticized by mixing the liquid metal and the plurality of solid metals.

The trace element, which is 0.01 to 0.5 wt. %, is one or more elements selected from the group consisting of: group IIIA elements, group IVA elements, group VA elements and group VIA elements.

As examples of the group IIIA elements, boron (B), aluminum (Al), gallium (Ga) and indium (In) may be given. As examples of the IVA elements, carbon (C), silicon (Si), germanium (Ge), tin (Sn) and lead (Pb) may be given. As examples of the group VA elements, nitrogen (N), phosphorus (P), arsenic (As) and antimony (Sb) may be given. As examples of the group VIA elements, selenium (Se) and tellurium (Te) may be given.

Furthermore, by reforming the multi-metal liquid alloy and the trace element, a viscous and paste-like liquid alloy mixture is obtained as the multi-metal alloy thermal paste.

Figure 6:
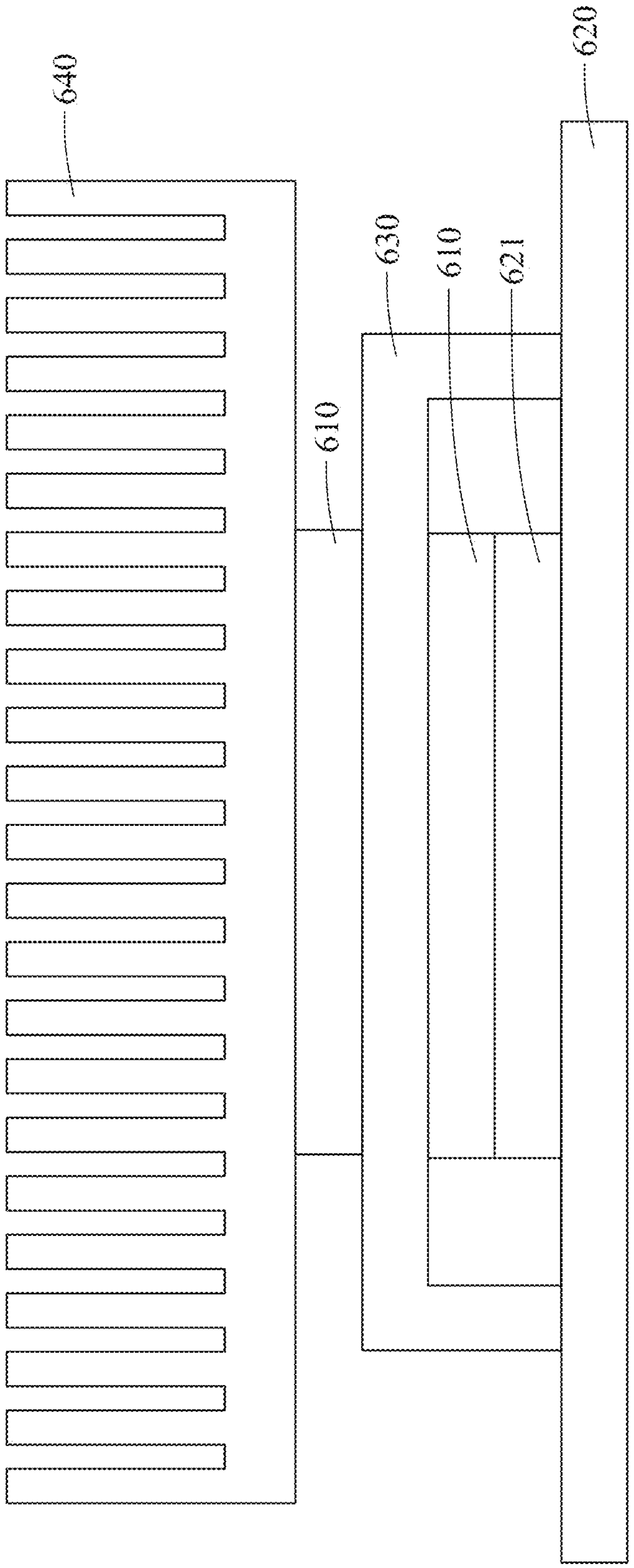
FIG. 6 is a schematic diagram illustrating a heat dissipation component and a multi-metal alloy thermal paste according to one embodiment of the present invention disposed on an electronic component.

FIG. 6 is a schematic diagram illustrating a multi-metal alloy thermal paste 610 of the present invention and a heat dissipation component disposed on an electronic component according to one embodiment of the present invention.

As shown in figure, a multi-metal alloy thermal paste 610 according to one embodiment of the present invention is coated and provided between an upper surface of an electronic component 621 disposed on a substrate 620 and a lower surface of a heat sink 630 as a heat dissipation component.

With today's technology, no matter how it is processed, the surface of the heat dissipation component will still have rough and uneven parts so that when the surfaces of the two components come into contact with each other, it is impossible to form a complete contact without gaps and will still have some air trapped in the gaps, and due to the very small thermal conductivity of the air, a large contact thermal resistance will be caused, leading to a low thermal conduction performance.

Such gaps can be filled by using the thermal interface material (TIM), which can reduce the contact thermal resistance and improve the thermal conduction performance.

Specifically, as shown in FIG. 6, according to one embodiment of the present invention, the multi-metal alloy thermal paste 610 provided between the upper surface of the electronic component 621 and the lower surface of the heat sink 630 is used as "TIM1" to transfer heat generated during the operation of the electronic component 621 to the heat sink 630.

Needless to say, the present invention is not limited to this. the multi-metal alloy thermal paste 610 according to one embodiment of the present invention may also be coated and provided between an upper surface of the heat sink 630 and a lower surface of heat sink fins 640 as another heat dissipation component. In this case, the multi-metal alloy thermal paste 610 of the present invention may also be used as "TIM2" for thermal conduction.

In the multi-metal alloy thermal paste 610 according to one embodiment of the present invention, the copper is a particle copper with a particle size of 5 nm to 5 μm.

Furthermore, according to one embodiment of the present invention, the multi-metal alloy thermal paste 610 may further comprises a thermal conductive particle, which is a metal, a metal oxide, a metal nitride or a carbon-based material.

Specifically, the metal is aluminum or gallium, the metal oxide is aluminum oxide or gallium oxide, the metal nitride is aluminum nitride or gallium nitride, and the carbon-based material is graphene, graphene oxide, carbon nanotubes, graphite, diamond, or synthetic diamond.

[Fabrication Method of Multi-Metal Alloy Thermal Paste]

Figure 7:
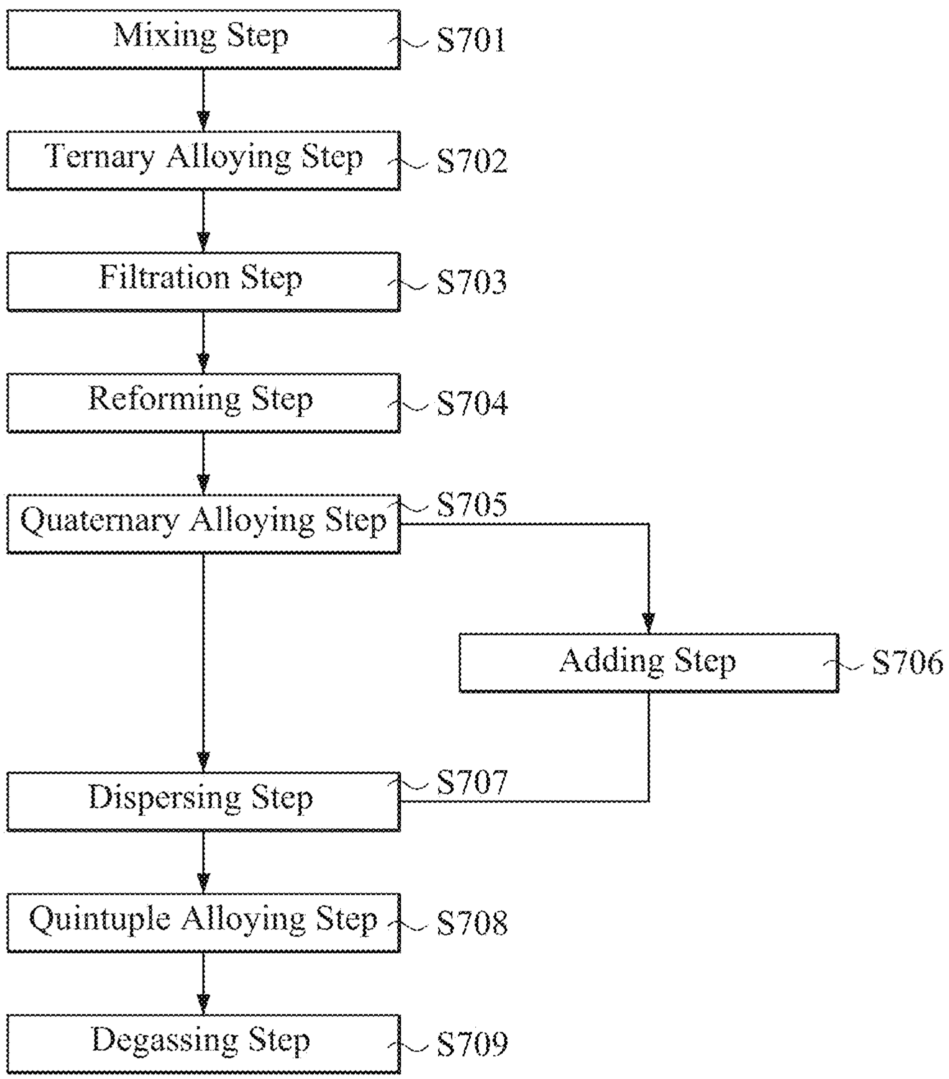
FIG. 7 is a flowchart of a fabrication method of a multi-metal alloy thermal paste according to the present invention.

A fabrication method of a multi-metal alloy thermal paste according to the present invention will be described below with reference to FIG. 7. FIG. 7 is a flowchart of a fabrication method of a multi-metal alloy thermal paste according to the present invention.

As shown in the figure, the fabrication method of the multi-metal alloy thermal paste according to the present invention comprises: a mixing step S701, a ternary alloying step S702, a filtration step S703, a reforming step S704, a quaternary alloying step S705, a dispersing step S707, a quintuple alloying step S708 and a degassing step S709.

Specifically, the mixing step S701 is preformed to mix a liquid metal and a plurality of solid metals.

Furthermore, the liquid metal includes 60 to 80 wt. % of gallium, the plurality of solid metals include 15 to 25 wt. % of indium and 5 to 15 wt. % of tin.

Next, the ternary alloying step S702 is performed. Specifically, in the ternary alloying step S702, the liquid metal and the plurality of solid metals are alloyed or eutecticized to form a ternary liquid alloy.

Next, the filtration step S703 is performed. Specifically, in the filtration step S703, the ternary liquid alloy is filtered to remove impurities therefrom.

Next, the reforming step S704 is performed. Specifically, the reforming step S704 is to add 0.01 to 0.5 wt. % of a trace element to the filtered ternary liquid alloy, and reform the ternary liquid alloy and the trace element to obtain a viscous and paste-like liquid alloy mixture.

Furthermore, in the reforming step S704, the added trace element is one or more elements selected from the group consisting of: group IIIA elements, group IVA elements, group VA elements and group VIA elements.

As examples of the group IIIA elements, boron (B), aluminum (Al), gallium (Ga) and indium (In) may be given. As examples of the group IVA elements, carbon (C), silicon (Si), germanium (Ge), tin (Sn) and lead (Pb) may be given. As examples of the group VA elements, nitrogen (N), phosphorus (P), arsenic (As) and antimony (Sb) may be given. As examples of the group VIA elements, selenium (Se) and tellurium (Te) may be given.

Next, the quaternary alloying step S705 is performed. Specifically, the quaternary alloying step S705 is to add 0.05 to 5 wt. % of a metal element of group IVA or VA elements to the liquid alloy mixture, and stir to form a quaternary liquid alloy.

Furthermore, the quaternary alloying step S705 is performed in an oxygen-free atmosphere at a temperature of 10° C. to 350° C.

Next, the dispersing step S707 is performed. Specifically, in the dispersing step S707, the quaternary liquid alloy is dispersed to uniformly distribute metal particles in the quaternary liquid alloy.

As a method of dispersing the quaternary liquid alloy, devices such as a hydrodynamic shear-based mixer, a kneader, a stirred ball mill, a roller mill, a disc mill or an ultrasonic homogenizer may be used to disperse the metal particles in the quaternary liquid alloy in a uniform distribution manner.

Next, the quintuple alloying step S708 is performed. Specifically, the quintuple alloying step S708 is to add 0.1 to 10 wt. % of copper to the dispersed quaternary liquid alloy and stir to form a quintuple liquid alloy.

Furthermore, the copper is a particle copper with a particle size of 5 nm to 5 μm.

Next, the degassing step S709 is performed. Specifically, in the degassing step S709, the quintuple liquid alloy is degassed to remove gas from the quintuple liquid alloy.

Finally, the degassed quintuple liquid alloy is obtained as the multi-metal alloy thermal paste.

Furthermore, the present invention is not limited to this, and as shown in FIG. 7, according to one embodiment of the present invention, the fabrication method of the multi-metal alloy thermal paste further comprises, after the quaternary alloying step S705 and before the dispersing step S707, an adding step S706.

Specifically, the adding step S706 is performed to add a thermal conductive particle to the quaternary liquid alloy, wherein the thermal conductive particle is a metal, a metal oxide, a metal nitride or a carbon-based material.

Furthermore, the metal which is added in the adding step S706 is aluminum or gallium, the metal oxide which is added in the adding step S706 is aluminum oxide or gallium oxide, the metal nitride which is added in the adding step S706 is aluminum nitride or gallium nitride, and the carbon-based material which is added in the adding step S706 is graphene, graphene oxide, carbon nanotubes, graphite, diamond, or synthetic diamond.

Figure 8:
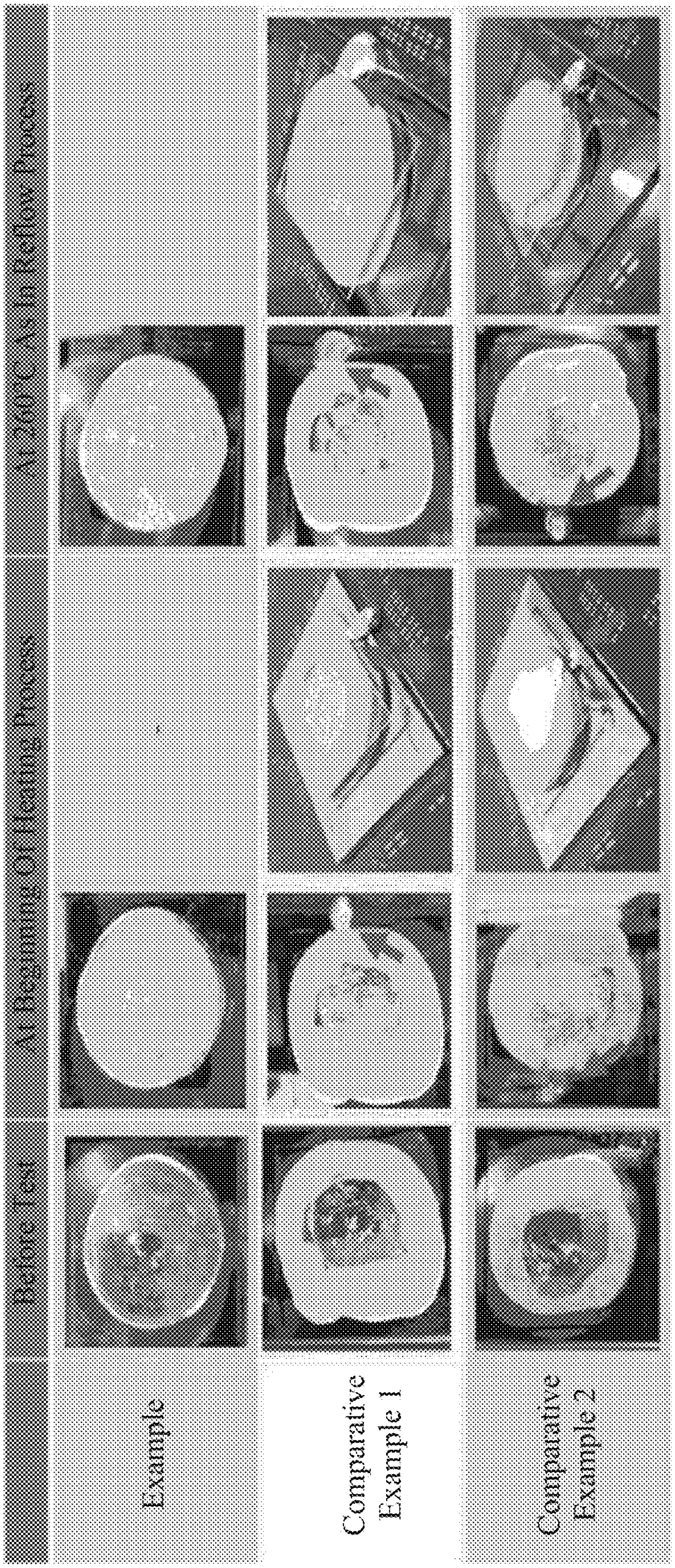
FIG. 8 shows pictures of a high temperature test performed on conventional thermal interface materials and a multi-metal alloy thermal paste according to the present invention.

FIG. 8 shows pictures of a high temperature test performed on the multi-metal alloy thermal paste according to the present invention and conventional thermal interface materials.

In detail, in the high temperature test, a transparent glass plate as a carrier is provided thereon with a containment material to enclose a containing space in the center. The containing space is coated with a multi-metal alloy thermal paste according to the present invention (Example) and two conventional liquid metals (Comparative Example 1 and Comparative Example 2), and is covered on the top with another transparent glass plate in this manner, samples of the high temperature test are prepared. Then, the samples coated with the multi-metal alloy thermal paste according to the present invention and the two conventional liquid metals are respectively heated to a temperature exceeding a high temperature process such as a reflow process in semiconductor packaging.

It can be seen from FIG. 8 that before the high temperature test, among the three samples, the multi-metal alloy thermal paste according to the present invention (Example) and two conventional liquid metals (Comparative Example 1 and Comparative Example 2) are retained in the containing space without leaking out. When the samples are heated in the high temperature treatment, the conventional liquid metals (Comparative Example 1 and Comparative Example 2) become more fluid after being heated, and flow out from the gap of the containment material. Furthermore, when the heating temperature reaches 260° C. as in the case of a reflow process for semiconductor packaging, the conventional liquid metals are ejected and leak to the outside of the containment material.

Compared with the conventional liquid metal, as shown in the figure, the multi-metal alloy thermal paste according to the present invention (Example) maintains the viscous paste form and does not leak before the test, at the beginning of the heating process and when subjected to 260° C. as in a reflow process for semiconductor packaging.

Figure 9:
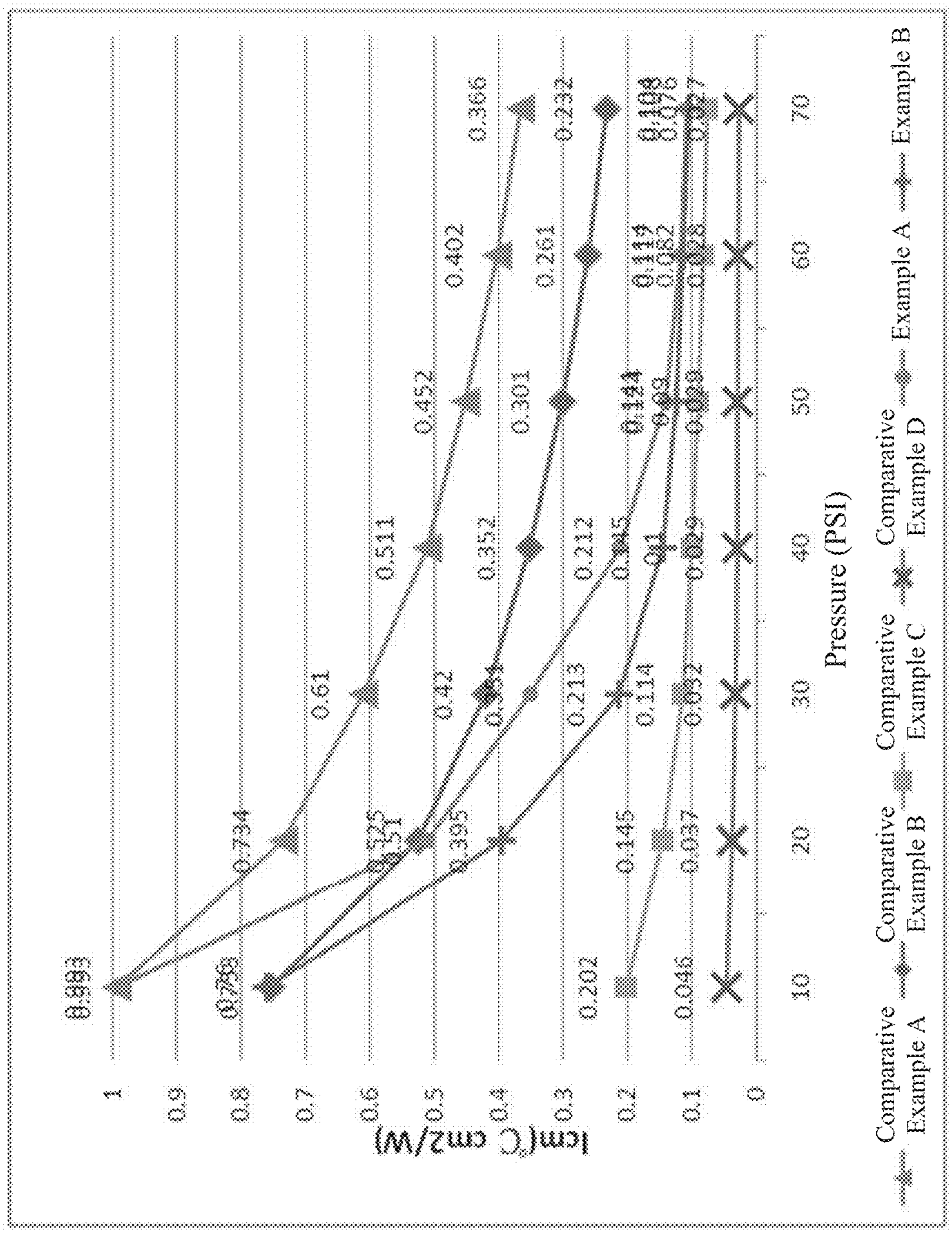
FIG. 9 is a line graph showing the thermal conduction performance of a liquid alloy thermal paste according to the present invention.
Figure 10:
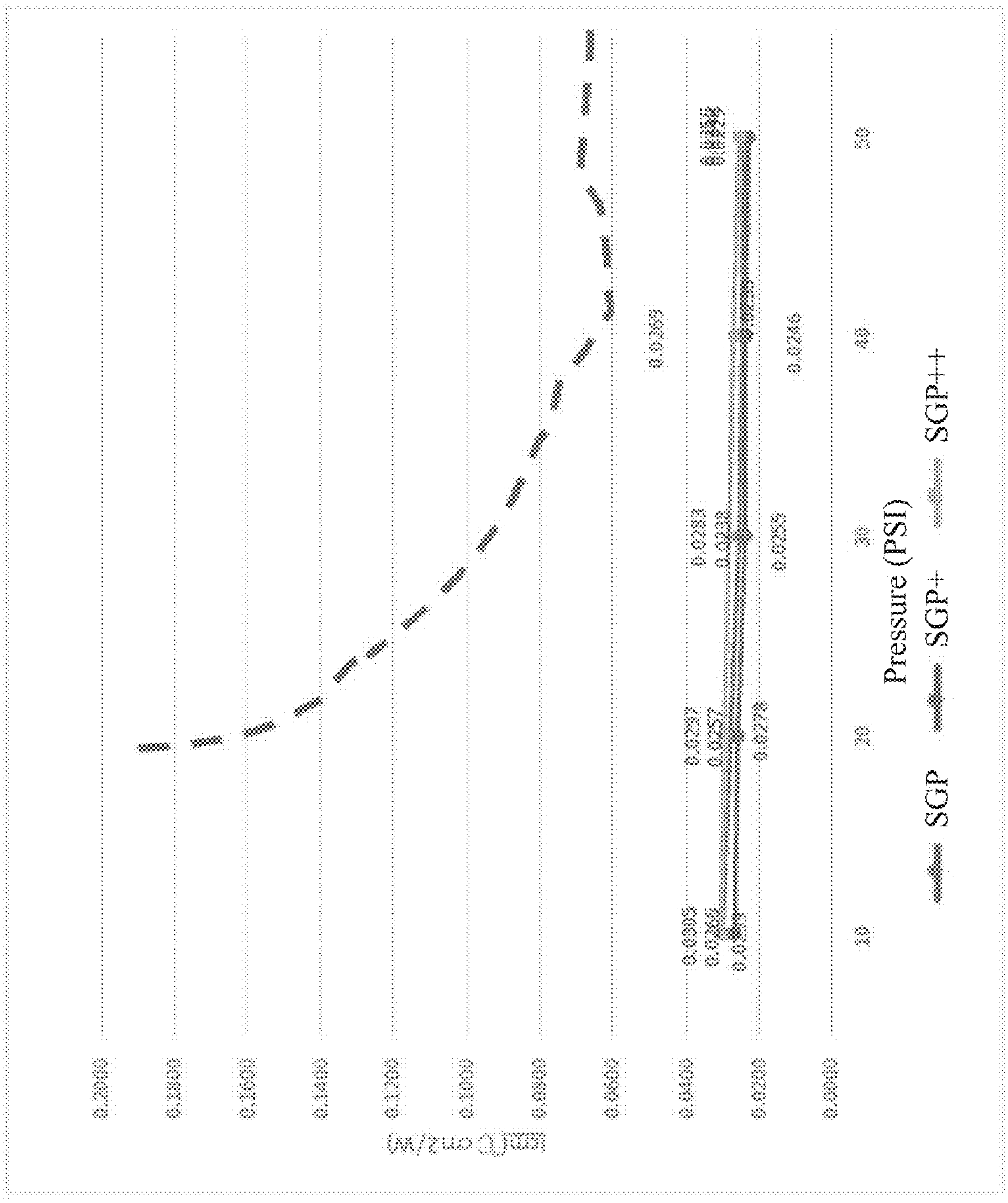
FIG. 10 is a line graph showing another thermal conduction performance of a liquid alloy thermal paste according to the present invention.

FIG. 9 is a line graph showing the thermal conduction performance of a multi-metal alloy thermal paste according to the present invention. FIG. 10 is a line graph showing the thermal conduction performance of a multi-metal alloy thermal paste according to the present invention. In FIG. 9 and FIG. 10, the vertical axis is the thermal impedance, and the horizontal axis is the pressure applied to a thermal paste.

The smaller the thermal impedance, the better the heat conduction performance. When the pressure applied to the thermal interface material is increased to make the thermal conductive ingredients in the thermal interface material denser, the efficiency of heat transfer increases, the thermal impedance decreases, and the thermal conduction performance becomes better. However, when the pressure applied to the thermal interface material is greater than 20 PSI, the thermal impedance of the thermal interface material does not change significantly.

In FIG. 9, "Example A" and "Example B" are both multi-metal alloy thermal pastes fabricated by the fabrication method according to the present invention, "Comparative Example A" and "Comparative Example B" are conventional "TIM1" products, and "Comparative Example C" and "Comparative Example D" are conventional liquid metals. It can be seen from FIG. 9 that although conventional liquid metals of "Comparative Example C" and "Comparative Example D" have good thermal conduction performance, neither of them can withstand high temperatures, and as shown in FIG. 8, both of them have the problem of leakage due to high temperatures and cannot be used as "TIM1" in semiconductor packaging. As shown in the figure, compared with the conventional "TIM1" products of "Comparative Example A" and "Comparative Example B", the multi-metal alloy thermal pastes according to the present invention both have superior thermal conduction performance, have the same high temperature resistance as the conventional "TIM1" products, and can be used as "TIM1" in semiconductor packaging.

In FIG. 10, "SGP", "SGP+" and "SGP++" are all multi-metal alloy thermal pastes fabricated by the fabrication method according to the present invention. It can be seen from FIG. 10 that the multi-metal alloy thermal pastes according to the present invention all have stable thermal conduction performance, and have the same or even better thermal conduction performance as compared to the conventional metal thermal paste (shown by a dotted line in the figure).

The characteristics of thermal greases, solid thermal pads, liquid metals and the multi-metal alloy thermal pastes according to the present invention are described below in accordance with Table 1.

TABLE 1

| | thermal grease | solid thermal pad | liquid metal | multi-metal alloy thermal pastes according to the present invention |
|---|---|---|---|---|
| Product Characteristic | thermal grease | metal | metal | alloy material-SGP |
| Ingredients | silicon oil and thermal conductive particles | Indium | liquid metal | multi-metal alloy |
| Appearance | paste | solid sheet | liquid | paste |
| Thermal Conductivity K (W/mK) | <10 W/mK | 85 W/mK | 75 W/mK | 10~100 W/mK or above |
| BLT (μm) | >150 μm | >100 μm | <100 μm | <100 μm |
| Thermal Resistance ($cm^2k/W$) @ 30 psi | >0.8 | 0.42~0.61 | 0.02~0.05 | 0.013~0.051 |
| Coating Operability (chip and lid side) | Fair, but pre-curing is required | No, the sheet can only be picked to die | Worst, excessive surface tension, difficult to coat chip | Good, excellent coatability, can be coated on chips or integrated into new lid |
| Resistance to Reflow Temperature | Yes | No | No | Yes |
| Tolerable Reflow Temperature | 260° C. | 157° C. | 10~30° C. | >300° C. |
| Delamination & Crack | Yes, worse | Unknown | No | No issue |
| Warpage Resistance | Very worse | Not possible good | Good | Excellent |
| Pump-Out Issues | Yes, worse | No | No | No issue |

TABLE 1-continued

| | thermal grease | solid thermal pad | liquid metal | multi-metal alloy thermal pastes according to the present invention |
|---|---|---|---|---|
| Applicable Packaging Type | Traditional Chips | PGA/LGA | No | All advanced package chips FCBGA/FO/2.5DIC/3DIC |
| Conformal Capacity | Poor | Very poor | Good | Excellent |

Table 1 shows a comparison of the advantages of various "TIM1" materials. It can be seen from Table 1 that although the thermal grease of the conventional thermal conductive materials has the characteristics of good coating operability and resistance to reflow temperature, the thermal conductivity and thermal resistance of the thermal grease are not good, and furthermore, the thermal grease has problems of delamination, crack, no warpage resistance, pump-out issues and poor conformal capacity. Therefore, although the thermal grease can be used as "TIM1" in semiconductor packaging, its thermal conductivity is insufficient, and has problem of delamination and pump-out issues, making it difficult to be applied to advanced package chips.

Furthermore, it can be seen from Table 1 that although the solid thermal pad (e.g., indium thermal pad) as the conventional thermal conductive materials has better thermal conduction performance (high thermal conductivity) and no pump-out issue, its melting point is 157° C., and thus there is a risk of melting in high temperature (>260° C.) environment such as a reflow process, and thus it can only be applied to PGA/LGA products, and cannot be effectively applied to advanced package chips (e.g., FCBGA, FO, 2.5D IC and 3D IC) that require a reflow process.

In addition, it can be seen from Table 1 that the liquid metal of the conventional thermal conductive materials has excellent thermal conduction performance (high thermal conductivity and low thermal resistance), and has the advantages of no delamination, no crack, warpage resistance, no pump-out issues, and batter conformal capacity, the liquid metal cannot be used as "TIM1" because it is a liquid and has high surface tension, resulting in difficult coating on the chop and leakage problems. Furthermore, the liquid metal of the conventional thermal conductive materials cannot withstand the high temperature of reflow process, and therefore cannot be applied to advanced package chips.

Compared with the conventional thermal conductive materials, the multi-metal alloy thermal paste according to the present invention not only has the same excellent thermal conduction performance (high thermal conductivity and low thermal resistance) as the conventional liquid metal, but also has excellent coatability to be coated on chips or integrated into new lid, can withstand the high temperature of reflow process (can even withstand temperatures greater than 300° C.), and has no issue of delamination, no issue of crack, excellent warpage resistance, no pump-out issue and excellent conformal capacity. Therefore, the multi-metal alloy thermal paste according to the present invention can be applied to various advanced semiconductor packages, and provides excellent thermal conduction performance with high thermal conductivity and low thermal resistance, has excellent coatability, and does not have problem of deterioration such as "pump-out".

With the technical means adopted by the present invention, the multi-metal alloy thermal paste has a stable, viscous and paste-like property, good adhesion, excellent thermal conduction performance and high temperature resistance to a reflow process, and can be evenly coated on the processor or electronic components to avoid the problem of short-circuiting of the surrounding circuits caused by overflowing from the processors or electronic components. Furthermore, the multi-metal alloy thermal paste according to the present invention can withstand high temperature processes such as a reflow process in chip packaging and SMT assembling, and can be applied to TIM1 material assembly for semiconductor packaging and PCBA SMT assembling.

Furthermore, the fabrication method of the multi-metal alloy thermal paste of the present invention can fabricate the multi-metal alloy thermal paste which has a stable, viscous and paste-like property, good adhesion, excellent thermal conduction performance and high temperature resistance to a reflow process, can be evenly coated on the processor or electronic components to avoid the problem of short-circuiting of the surrounding circuits caused by overflowing from the processors or electronic components, can withstand high temperature processes such as a reflow process in chip packaging and SMT assembling, and can be applied to TIM1 material assembly for semiconductor packaging and PCBA SMT assembling.

The above description should be considered as only the discussion of the preferred embodiments of the present invention. However, a person having ordinary skill in the art may make various modifications without deviating from the present invention. Those modifications still fall within the scope of the present invention.

What is claimed is:

1. A liquid alloy thermal paste, comprising:

a liquid alloy including a liquid metal and a plurality of solid metals, the liquid metal including 60 to 80 wt. % of gallium, the plurality of solid metals including 15 to 25 wt. % of indium and 5 to 15 wt. % of tin, the liquid metal and the plurality of solid metals being alloyed or eutecticized by mixing the liquid metal and the plurality of solid metals; and a trace element, which is 0.01 to 0.5 wt. %, including boron and one or more elements selected from the group consisting of:

carbon, silicon, germanium, tin and lead of group IVA elements, nitrogen, phosphorus, arsenic, antimony and bismuth of group VA elements, and selenium and tellurium of group VIA elements, wherein by stirring the liquid alloy and the trace element to reform, a viscous and paste alloy mixture is obtained as the liquid alloy thermal paste.

2. The liquid alloy thermal paste as claimed in claim 1, further comprising a thermal conductive particle, which is a metal, a metal oxide, a metal nitride or a carbon-based material.

3. The liquid alloy thermal paste as claimed in claim 2, wherein the metal is copper, zinc, aluminum, or gallium, the metal oxide is copper oxide, zinc oxide, or gallium oxide, the metal nitride is aluminum nitride or gallium nitride, and the carbon-based material is graphene, graphene oxide, carbon nanotubes, graphite, diamond, or synthetic diamond.

4. A multi-metal alloy thermal paste, comprising:

a multi-metal liquid alloy, which is a quaternary liquid alloy or a quintuple liquid alloy, including a liquid metal and a plurality of solid metals, the liquid metal including 60 to 80 wt. % of gallium, the plurality of solid metals including 15 to 25 wt. % of indium, 5 to 15 wt. % of tin, 0.1-10 wt. % of copper and 0.05-5 wt. % of a metal element of group IVA or VA elements, the liquid metal and the plurality of solid metals being alloyed or eutecticized by mixing the liquid metal and the plurality of solid metals; and a trace element, which is 0.01 to 0.5 wt. %, including boron and one or more elements selected from the group consisting of:

carbon, silicon, germanium and lead of group IVA elements, nitrogen, phosphorus, arsenic and antimony of group VA elements, and selenium and tellurium of group VIA elements, wherein by reforming the liquid alloy and the trace element, a viscous and paste alloy mixture is obtained as the multi-metal alloy thermal paste.

5. The multi-metal alloy thermal paste as claimed in claim 4, further comprising a thermal conductive particle, which is a metal, a metal oxide, a metal nitride or a carbon-based material.

6. The multi-metal alloy thermal paste as claimed in claim 5, wherein the metal is aluminum or gallium, the metal oxide is aluminum oxide or gallium oxide, the metal nitride is aluminum nitride or gallium nitride, and the carbon-based material is graphene, graphene oxide, carbon nanotubes, graphite, diamond, or synthetic diamond.

* * * * *